United States Patent [19]

Konuma et al.

[11] Patent Number: 5,672,900
[45] Date of Patent: Sep. 30, 1997

[54] INSULATED GATE FIELD EFFECT TRANSISTOR WITH AN ANODIC OXIDIZED GATE ELECTRODE

[76] Inventors: Toshimitsu Konuma, 796-7, Tomuro; Akira Sugawara, Flat SEL 101, 304-1, Hase; Takahiro Tsuji, Flat SEL-B 203, 304-1, Hase, all of Atsugi-shi, Kanagawa-ken 243, Japan

[21] Appl. No.: 588,677

[22] Filed: Jan. 19, 1996

Related U.S. Application Data

[63] Continuation of Ser. No. 219,378, Mar. 29, 1994, abandoned.

[30] Foreign Application Priority Data

Mar. 30, 1993 [JP] Japan .................................. 5-096667

[51] Int. Cl.[6] ........................ H01L 29/76; H01L 31/036; H01L 27/01; H01L 27/088
[52] U.S. Cl. ........................ 257/410; 257/66; 257/347; 257/900
[58] Field of Search ........................ 257/66, 900, 72, 257/347, 350, 352, 353, 368, 410, 411

[56] References Cited

U.S. PATENT DOCUMENTS 5,289,030  2/1994  Yamazaki et al. ........................ 257/66

FOREIGN PATENT DOCUMENTS 2-306664  12/1990  Japan ........................ 257/352

*Primary Examiner*—Steven H. Loke
*Attorney, Agent, or Firm*—Sixbey, Friedman, Leedom & Ferguson; Gerald J. Ferguson, Jr.; Bradley D. Blanche

[57] ABSTRACT

A thin-film transistor (TFT) comprising an active region provided on a substrate and a gate electrode on the active region. A porous anodic oxide film is provided on the sides and top of the gate electrode where the lateral thickness of the anodic oxide provided on the side surface is larger than the vertical thickness of the anodic oxide provided on the top surface or where a first anodic oxide is provided on both the top and side surfaces and a second anodic oxide is provided on the side surfaces wherein the first anodic oxide is interposed between the second anodic oxide and the side surfaces of the gate electrode.

10 Claims, 3 Drawing Sheets a: Present Invention
b: Prior Art

INSULATED GATE FIELD EFFECT TRANSISTOR WITH AN ANODIC OXIDIZED GATE ELECTRODE

This application is a continuation of Ser. No. 08/219,378, filed Mar. 29, 1994, now abandoned.

BACKGROUND OF THE INVENTION

1. Field of the Invention

The present invention relates to the structure and production method of a field effect transistor of thin-film insulator gate type (so-called thin-film transistor, abbreviated as TFT).

2. Description of the Prior Art

Thin-film devices such as field effect transistors of thin-film insulator gate type (TFT) have the known property that the source-drain leakage current is reduced if the gate electrode is offset from the source and drain regions. For the magnitude of this offset a high accuracy of the order of submicrons has been required. If the magnitude of the offset changes by for example more than 0.5 μm, the characteristics of the TFT change completely. Thus, appropriate control is required to achieve an accuracy of 0.1 μm or less, and preferably 500 Å or less. Such control, however, is not possible with photolithography.

As an approach to this problem, it has been proposed that an offset be obtained by forming a gate electrode from a material capable of anodic oxidation and anodically oxidizing the gate electrode to form an anodic oxide film thinner than 0.5 μm on it with an accuracy of 100 Å or better, and introducing impurities by ion doping or ion implantation with this as a mask. (Japanese Patent Application No. H.3-237100)

An example of a conventional TFT in which an anodic oxide film of this kind has been used is shown in FIG. 2. FIG. 2(E) is a top view of the TFT, FIG. 2(A) is a sectional view (a section perpendicular to the gate electrode) taken in the direction of the arrows A–A' in FIG. 2(E), and FIG. 2(C) is a sectional view (a section parallel to the gate electrode) taken in the direction of the arrows B–B' in FIG. 2(E).

On a substrate (22) and a base insulation film (23) is formed an island-shaped semiconductor film (24) having an active region (a channel-forming region) and impurity regions (source and drain), and a gate insulation film (25) is formed on top of that. On this gate insulation film is formed a gate electrode (26), and on periphery (the top and sides) of this there is an anodic oxide film (27).

Because impurities are introduced into the semiconductor film (24) after the periphery of the gate electrode has been anodically oxidized, as is clear from FIG. 2 the impurity regions (hatched area) and the gate electrode are separated by a distance equal to the thickness [x] of the anodic oxide film (i.e. the gate is offset). The anodic oxide film on the sides of the gate electrode has been necessary for creating the offset. In addition, because the anodic oxide film on the top surface is necessary in order to improve the insulation between the gate electrode interconnect and interconnects above it, the anodic oxide film there should be dense (non-porous) and be of high resistance.

It has been understood that in general the greater the magnitude of offset, the smaller the source-drain leakage current. For the leakage current to be sufficiently small, it has been necessary for the anodic oxide film to be made thicker than 0.2 μm, and preferably thicker than 0.4 μm.

However, to obtain a thick anodic oxide film like this a high anodization voltage has been necessary. Hitherto, the anodization voltage needed to obtain a 0.4 μm thick, non-porous anodic oxide film has been as high as 400 V, but the voltage applied to the gate electrode at this time partly acts across the semiconductor film (24) and the gate electrode (26), and this has tended to cause permanent damage to the gate insulating film (25) and increase the density of interface levels. As a result, yields and reliability have been reduced.

Also, for example, when the gate electrode is made of aluminum, the formation of an anodic oxide film of 0.4 μm thickness involves the oxidation of aluminum of about 0.2 μm thickness; this has meant that the aluminum of the gate electrode has to be made thicker than 0.2 μm, and preferably thicker than 0.4 μm. For example, when the initial aluminum film thickness is made 0.4 μm and an anodic oxide film of 0.4 μm thickness is formed, an aluminum gate electrode of 0.2 μm thickness remains, as shown in FIG. 2(B), and as a result the total thickness of the gate electrode and the anodic oxide film becomes 0.6 μm. Generally, in order to obtain good yields, it is desirable that the step heights of gate interconnects and the like be made less than 0.5 μm, and in the above example this is exceeded. Furthermore, because the height of the actual interconnect is 0.2 microns, its resistance increases and the characteristics of the TFT deteriorate.

The present inventors have observed that in locations such as the stepped part (29) of the film shown in FIG. 2(D) the anodic oxidation of the film proceeds markedly rapidly and sometimes, as shown in FIG. 2(D), it is oxidized almost completely and the interconnect is substantially disconnected.

SUMMARY OF THE INVENTION

The present invention was devised in view of this kind of problem, and has among its objects that of improving the TFT reliability and yield by lowering the maximum anodization voltage and those of achieving an offset greater than 0.2 μm, and preferably greater than 0.5 μm, and making the height of the gate electrode and the anodic oxide as low as possible by selectively growing the anodic oxide film on the sides.

According to the present invention, the above-mentioned problems are solved by combining two kinds of anodic oxides, a porous one and a non-porous one. Specifically, in this invention, a porous anodic oxide film of thickness greater than 0.2 μm and preferably greater than 0.5 μm is formed on the sides of the Mate electrode using a comparatively low voltage, and an insulating, non-porous anodic oxide film is formed on the top of the gate electrode.

The porous anodic oxide film is obtained by anodic oxidation carried out in a 3–20% aqueous solution of citric acid or oxalic acid, phosphoric acid, chromic acid, sulfuric acid or the like. The non-porous anodic oxide film, on the other hand, is obtained by anodic oxidation performed in a 3–10% solution of tartaric acid, boric acid, nitric acid or the like in an organic solvent such as ethylene glycol. It is desirable that the non-porous anodic oxide film formed on the top of the gate electrode be as thin as possible (as long as insulation from interconnects above is maintained), and it should be thinner than 0.2 μm and preferably thinner than 0.1 μm.

These two types of anodic oxide can be obtained by forming a mask on the top of the gate electrode and first forming the porous anodic oxide film, and then removing the mask and forming the non-porous anodic oxide film mainly on the top of the gate electrode. It is necessary that the mask used for this purpose withstand the anodization voltage, and for example polyimide and the like are suitable. In particular, if it is a photosensitive material such as "Photoneece" (photosensitive polyimide) or "AZ1350", the mask may be used for the patterning of the gate electrode.

The porous anodic oxide film may be used as it is without particular treatment; however, so-called sealing treatment may be performed to improve the insulation of the side surfaces.

The structure of the invention will now be explained in detail with reference to a preferred embodiment.

DESCRIPTION OF THE PREFERRED EMBODIMENTS

Figure 1A:
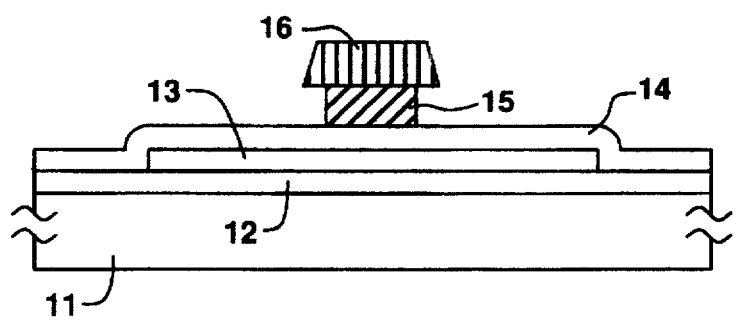
FIGS. 1(A) to 1(E) are sectional views illustrating a process for producing a TFT according to a preferred embodiment of the invention.
Figure 1B:
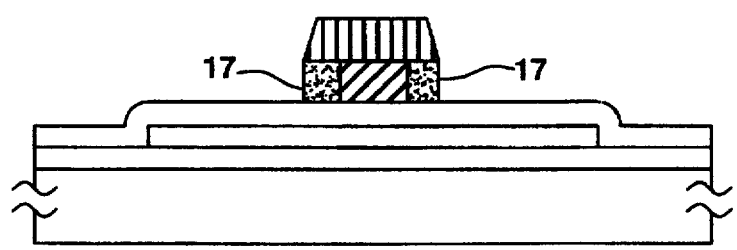
Figure 1C:
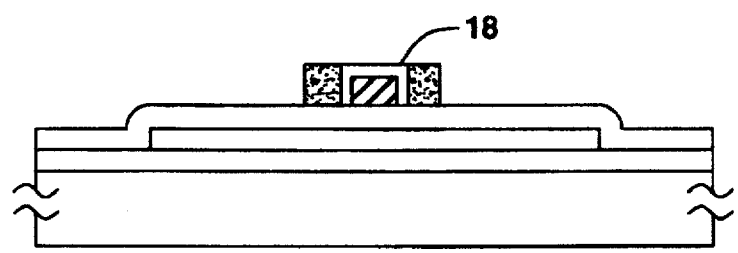
Figure 1D:
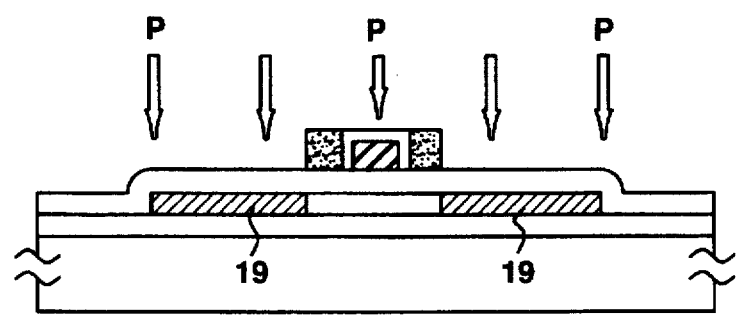
Figure 1E:
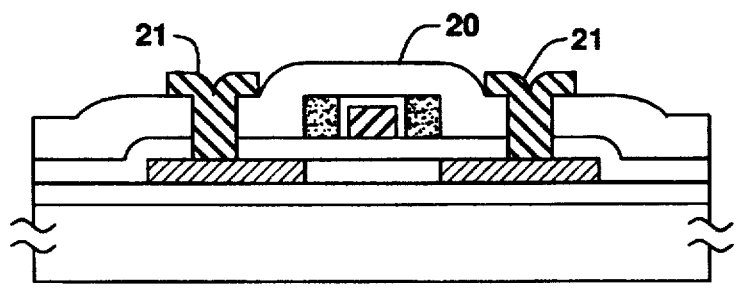
Figure 2A:
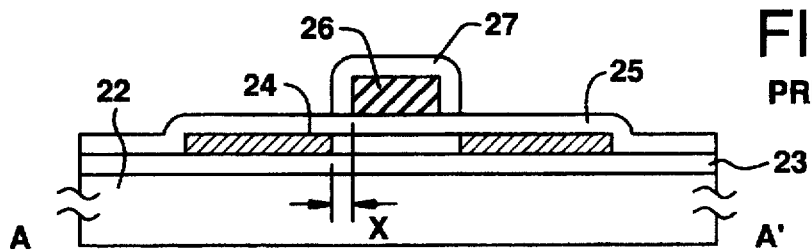
FIGS. 2(A) to 2(E) are sectional views illustrating an example of a conventional TFT and problems associated with it.
Figure 2B:
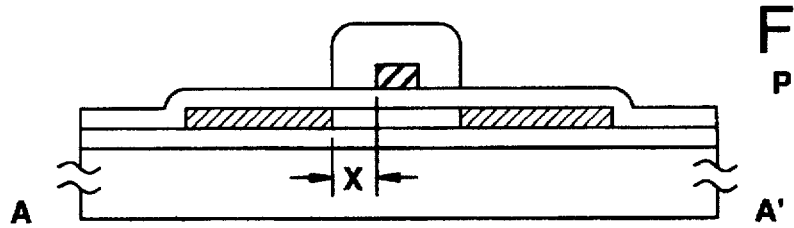
Figure 2C:
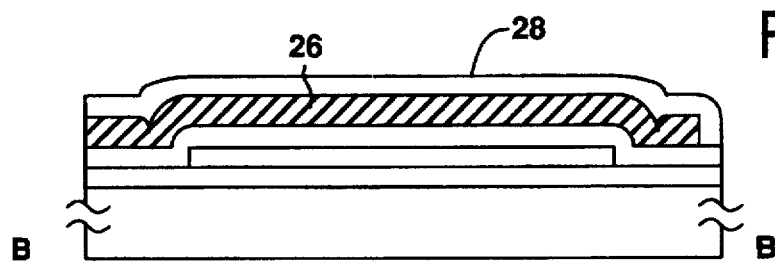
Figure 2D:
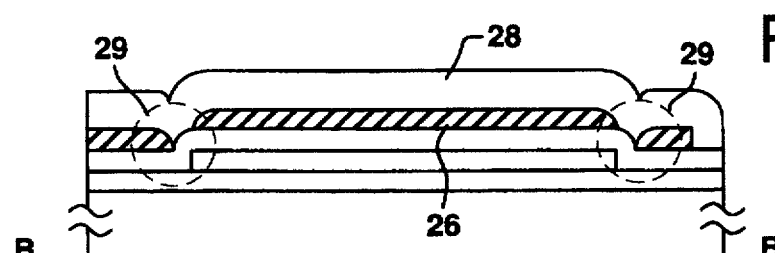
Figure 2E:
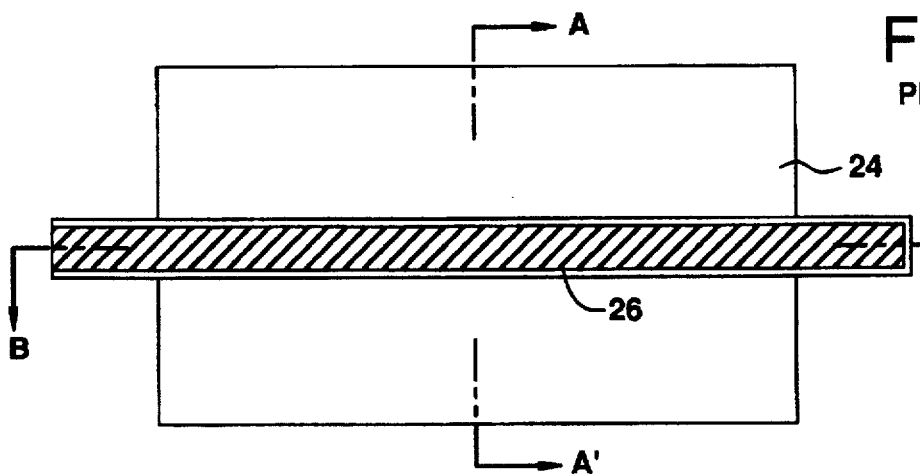

The process employed in this preferred embodiment is shown in sectional views in FIG. 1. First, a 2000 Å thick silicon oxide base film (12) was formed on a substrate (Corning 7059) (11) by sputtering. Then, an intrinsic (I type) amorphous silicon film 500–1500 Å thick, for example 1500 Å thick, was deposited by plasma CVD. Then, a 200 Å thick silicon oxide film was deposited by sputtering.

This amorphous silicon film was crystallized by annealing in nitrogen at 550° C. for 4 hours. After the annealing, the silicon film was patterned to make an island-shaped silicon region (13), and by sputtering a 1000 Å thick silicon oxide film (14) was deposited as a gate insulating film. In the sputtering, silicon oxide was used as the target, the substrate temperature during sputtering was 200°–400° C., for example 250° C., and the sputtering atmosphere was argon and oxygen in the ratio argon/oxygen=0 to 0.5, for example below 0.1.

Consecutively with this, an aluminum film (containing 1–3% silicon) 3000–5000 Å thick, for example 4000 Å thick, was deposited by sputtering. (It is desirable that the steps of forming the silicon oxide film and the aluminum film be carried out consecutively.) A photoresist having good voltage withstanding properties, such as Shipley Co.'s AZ1350, about 1 μm thick was formed on this aluminum film by spin coating. The photoresist was patterned by a known lithography process to form a gate electrode (15). The photoresist mask (18) remains on the gate electrode. Similar effects can be obtained using for example a photosensitive polyimide such as UR3800, made by Toray Industries Co., instead of the photoresist. (FIG. 1(A))

Then, by immersing the substrate in a 10% aqueous solution of citric acid and carrying out anodic oxidation at a constant voltage of 10–50 V, for example 10 V, for 10–50 minutes, for example 30 minutes, it was possible to form a porous anodic oxide film (17) about 3000 Å thick on the side of the gate electrode with a precision of 200 Å or better. Alternatively, the anodic oxidation may be carried out in an 8% oxalic acid solution at 30–40 V. Because the mask was present on the top of the gate electrode, almost no anodic oxidization took place there at all. (FIG. 1(B))

Next, the mask was removed and the top of the gate electrode was exposed, the substrate was immersed in a 3% solution of tartaric acid in ethylene glycol (pH-adjusted to neutral with ammonia), and anodic oxidation was carried out by passing an electric current through this so that the voltage increased at a rate of 1–5 V/min, for example 4 V/min. In this process, anodic oxidation took place on the sides as well as the top of the gate electrode, and a dense anodic oxide film (18) of thickness 1000 Å was formed. The withstand voltage of this anodic oxide film was higher than 50 V. (FIG. 1(C))

Next, the silicon region (13) was doped with an impurity (phosphorus) by plasma doping, with the gate electrode as a mask. Phosphine ($PH_3$) was used as the doping gas, and the accelerating voltage was 60–90 kV, for example 80 kV. The dose was $1 \times 10^{15}$ to $8 \times 10^{15}$ cm$^{-2}$, for example $2 \times 10^{15}$ cm$^{-2}$. In this way N-type impurity regions (19) were formed. (FIG. 1(D))

Next, the substrate was annealed by irradiation from the top surface with laser light to activate the doped impurity. A KrF excimer laser (wavelength 248 nm, pulse width 30 ns) was used as the laser, but a XeCl excimer laser (wavelength 308 nm), an ArF excimer laser (wavelength 193 nm), a XeF excimer laser (wavelength 353 nm) or the like may alternatively be used.

The energy density of the laser was 200–400 mJ/cm$^2$, for example 250 mJ/cm$^2$, and irradiation of 2–10 shots, for example 2 shots, was performed. For the laser irradiation, the substrate was heated to 200°–300° C., for example 250° C. In this way the impurity region (19) was activated.

Then, a silicon oxide film (20) of thickness 6000 Å was formed as an interlayer insulator by plasma CVD, contact holes were made in this, and electrodes/interconnects (21) for the source and drain regions of the TFT were formed with a multilayer film of metallic material, for example titanium nitride and aluminum. Finally, annealing was performed in a hydrogen atmosphere at 1 atmosphere and at 350° C. for 30 minutes. By the above steps a thin-film transistor was obtained. (FIG. 1(E))

Figure 3:
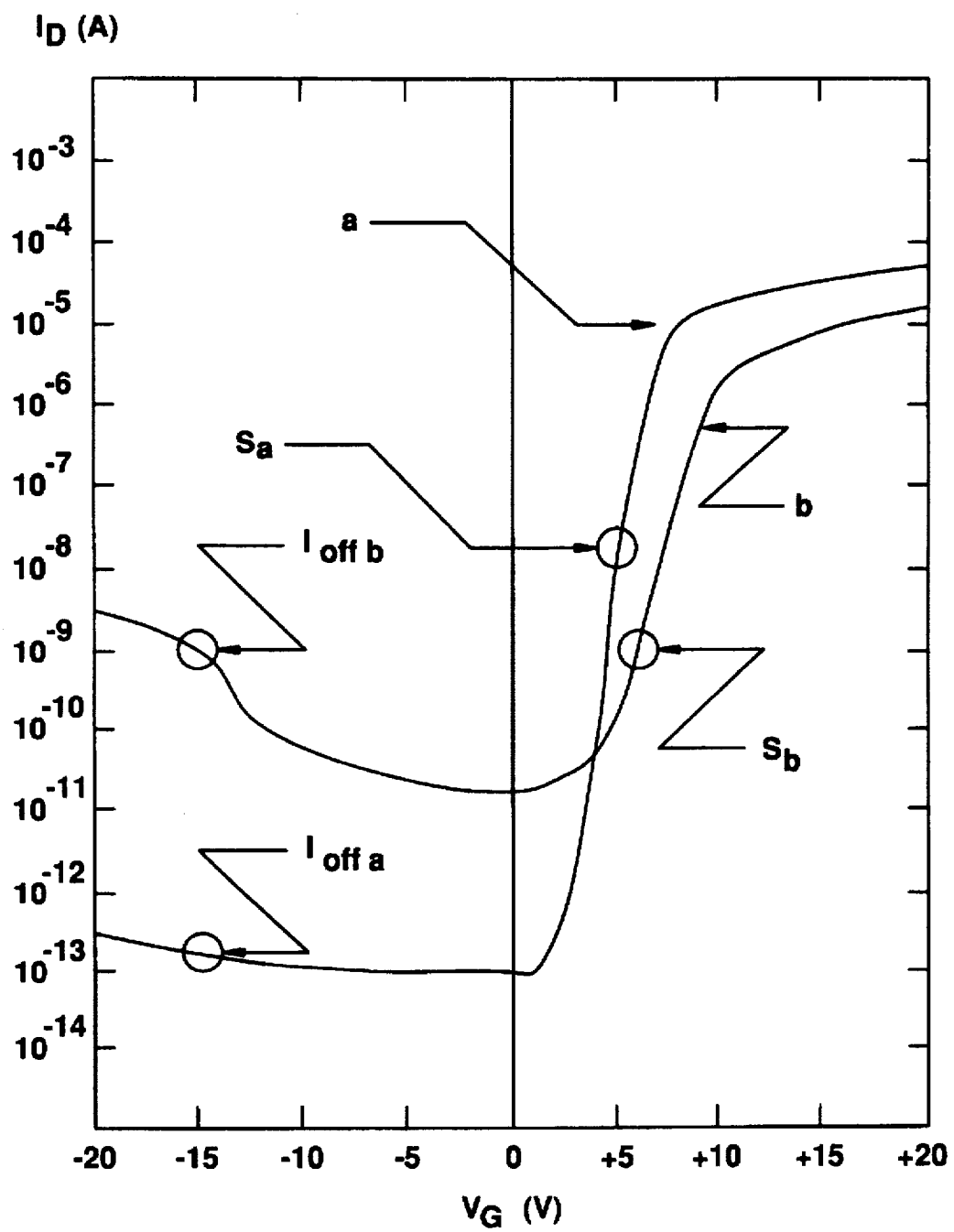
FIG. 3 shows the characteristics of a TFT produced according to the preferred embodiment of the present invention and the characteristics of a TFT produced by a conventional method.

FIG. 3 shows the characteristics of a TFT obtained according to this preferred embodiment and the characteristics of a TFT obtained by a conventional method (Japanese Patent Application No. H.3-237100). The TFT obtained by the conventional method was anodically oxidized in a 3% solution of tartaric acid in ethylene glycol (pH-adjusted to neutral with ammonia) with the voltage being increased to 220 V at a rate of 4 V/min. This resulted in a 2000 Å thick anodic oxide film being formed, with the offset being about 2000 Å. In the case of the TFT of the present preferred embodiment, on the other hand, the offset was as great as about 4000 Å (3000 Å of porous anodic oxide film plus 1000 Å of non-porous anodic oxide film), and as a result the leak current ($I_{OFF}$) was extremely low.

Moreover, because no excessive voltage was applied to the gate insulating film during the anodic oxidation, the interface level density of the gate insulating film was low; consequently the subthreshold characteristic (S value) of the TFT was extremely low, and as a result the steep rise characteristic shown in FIG. 3 was obtained.

When both of the TFT samples were tested for characteristic deterioration by the application of a long-duration bias voltage, the difference between the two became large, and, for example, after the source was grounded and a voltage of 25V was applied to the gate and drain for 100 hours, whereas the conventional TFT exhibited no characteristic at all, the TFT of the present preferred embodiment merely suffered a 20% decrease in ON-current and a 30% increase in leakage current.

As described in detail with reference to the above preferred embodiment, a TFT according to the present invention is superior to a conventional TFT in both reliability and characteristics. Also, because in a TFT according to the present invention the height of the Sate electrode and anodic oxide film is kept down, it is less liable to pinholes and disconnection caused by steps, and consequently high yields can be obtained. Furthermore, there is no disconnection whatsoever of the Mate interconnect during anodic oxidization. Thus, the present invention is of industrial value.

What is claimed is:

1. A transistor comprising:

an active region comprising a semiconductor material;

a gate electrode provided over said active region, said gate electrode comprising an anodizable material; and a first anodic oxide of the material of said gate electrode provided on a side surface and a top surface of said gate electrode; and a second anodic oxide of the material of said gate electrode provided adjacent to the side surface of said gate electrode with said first anodic oxide interposed therebetween, wherein said second anodic oxide is more porous than said first anodic oxide.

2. The transistor of claim 1 wherein lateral thickness of the second anodic oxide is larger than vertical thickness of the first anodic oxide provided on said top surface.

3. The transistor of claim 2 wherein said lateral thickness of the second anodic oxide is 0.2 μm or more.

4. The transistor of claim 2 wherein said vertical thickness of the first anodic oxide provided on said top surface is 0.2 μm or less.

5. The transistor of claim 2 further comprising a source and a drain sandwiching said active region therebetween.

6. The transistor of claim 5 wherein said active region, said source and drain are provided in a semiconductor island.

7. The transistor of claim 2 wherein at least one of a source and a drain is offset from said gate electrode substantially at a distance of said lateral thickness of said second anodic oxide and a lateral thickness of said first anodic oxide.

8. A thin film transistor formed on a substrate comprising:

a semiconductor layer having at least source, drain and channel regions;

a gate electrode adjacent to said channel region with a gate insulating layer therebetween;

an insulating layer comprising an oxide of a material of said gate electrode formed on an upper surface and a side surface of said gate electrode; and a first offset region formed between said channel region and said source region and a second offset region formed between said channel region and said drain region, wherein a lateral thickness of said insulating layer on the side surface of said gate electrode is larger than a vertical thickness of said insulating layer on the upper surface of the gate electrode, and boundaries between said first offset region and said source region and between said second offset region and said drain region are substantially aligned with outer side edges of said insulating layer.

9. The thin film transistor of claim 8 wherein said gate electrode is located over said channel region.

10. The thin film transistor of claim 8 wherein said oxide is an anodic oxide of the material of said gate electrode.

* * * * *

UNITED STATES PATENT AND TRADEMARK OFFICE
CERTIFICATE OF CORRECTION

PATENT NO. : 5,672,900  
APPLICATION NO. : 08/588677  
DATED : September 30, 1997  
INVENTOR(S) : Tohimitsu Konuma et al.

Page 1 of 1

It is certified that error appears in the above-identified patent and that said Letters Patent is hereby corrected as shown below:

On the Title Page Item (73), please insert the Assignee's name --Semiconductor Energy Laboratory Co., Ltd.--.

Signed and Sealed this

Third Day of November, 2009

David J. Kappos  
*Director of the United States Patent and Trademark Office*